(12) United States Patent
Chang et al.

(10) Patent No.: US 9,035,382 B2
(45) Date of Patent: May 19, 2015

(54) SEMICONDUCTOR STRUCTURE PROFILE

(71) Applicant: Taiwan Semiconductor Manufacturing Company Limited, Hsin-Chu (TW)

(72) Inventors: Che-Cheng Chang, New Taipei (TW); Jr-Jung Lin, Wurih Township (TW); Yi-Jen Chen, Hsinchu (TW); Yung Jung Chang, Cyonglin Township (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/799,227

(22) Filed: Mar. 13, 2013

(65) Prior Publication Data

US 2014/0264589 A1 Sep. 18, 2014

(51) Int. Cl.
*H01L 29/78* (2006.01)
*H01L 29/66* (2006.01)

(52) U.S. Cl.
CPC ........ *H01L 29/7833* (2013.01); *H01L 29/6659* (2013.01)

(58) Field of Classification Search
CPC ............ H01L 29/78; H01L 21/823807; H01L 29/66545; H01L 21/823814; H01L 21/823842; H01L 21/28; H01L 29/66477; H01L 29/7833; H01L 29/6659; H01L 29/7848; H01L 29/7869; H01L 21/8238; H01L 21/823864
USPC .......................................... 257/344; 438/299
See application file for complete search history.

(56) References Cited

U.S. PATENT DOCUMENTS

| 6,207,995 B1 * | 3/2001 | Gardner et al. ............... 257/344 |
| 8,193,586 B2 * | 6/2012 | Chen et al. .................... 257/344 |
| 2012/0146159 A1 * | 6/2012 | Wang et al. ................... 257/410 |

* cited by examiner

*Primary Examiner* — Monica D Harrison
(74) *Attorney, Agent, or Firm* — Cooper Legal Group, LLC

(57) ABSTRACT

One or more embodiments of techniques or systems for forming a semiconductor structure are provided herein. In some embodiments, a semiconductor structure includes a substrate, a first lightly doped drain (LDD), a second LDD, an interface layer (IL), a high-k stack, a gate region, a dummy poly region, a first hard mask (HM) region, a second HM region, and a seal spacer region. The HK stack has a HK stack width and the gate region has a gate region width that is less than or substantially equal to the HK stack width. Because of the increased width of the HK stack, some of the HK stack likely overlaps some of the first LDD or the second LDD. In this manner, a saturation current and a threshold voltage associated with the semiconductor structure are improved. The increased width of the HK stack also protects more of the IL during LDD implanting.

20 Claims, 13 Drawing Sheets understood# SEMICONDUCTOR STRUCTURE PROFILE

BACKGROUND

Generally, a semiconductor structure or device, such as a transistor, comprises a stack of various materials.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more embodiments of techniques or systems for forming a semiconductor structure are provided herein. Generally, a semiconductor structure includes an interface layer (IL) on a substrate, a high-k (HK) stack on the IL, a gate region on the HK stack, a dummy poly region on the gate region, and a seal spacer region surrounding the HK stack, the gate region, the dummy poly region, etc. The seal spacer region mitigates interfacial layer growth, and protects the dummy poly region during fabrication. The seal spacer region also, however, blocks dopants from being implanted into certain areas of the substrate, such as under or close to the HK stack. For example, dopants from a lightly doped drain (LDD) implanting process are blocked from being implanted under the HK stack. In this manner, a gap or lateral distance exists between the HK stack the LDD. It will be appreciated that such a gap between the LDD and the HK stack causes an undesired saturation current and threshold voltage for the semiconductor structure. Additionally, the IL is often damaged during LDD implanting, which degrades a breakdown voltage for the semiconductor structure. In some embodiments provided herein, a semiconductor structure thus includes a gate region having a gate region width and a HK stack having a HK stack width such that the HK stack width is greater than the gate region width. Because of the HK stack width, the HK stack is laterally closer to and possibly overlaps at least some of an LDD implanted into the substrate, thereby improving saturation current and threshold voltages associated with the semiconductor structure. Additionally, because of the HK stack width, a greater amount or surface area of the IL is protected during LDD implanting.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
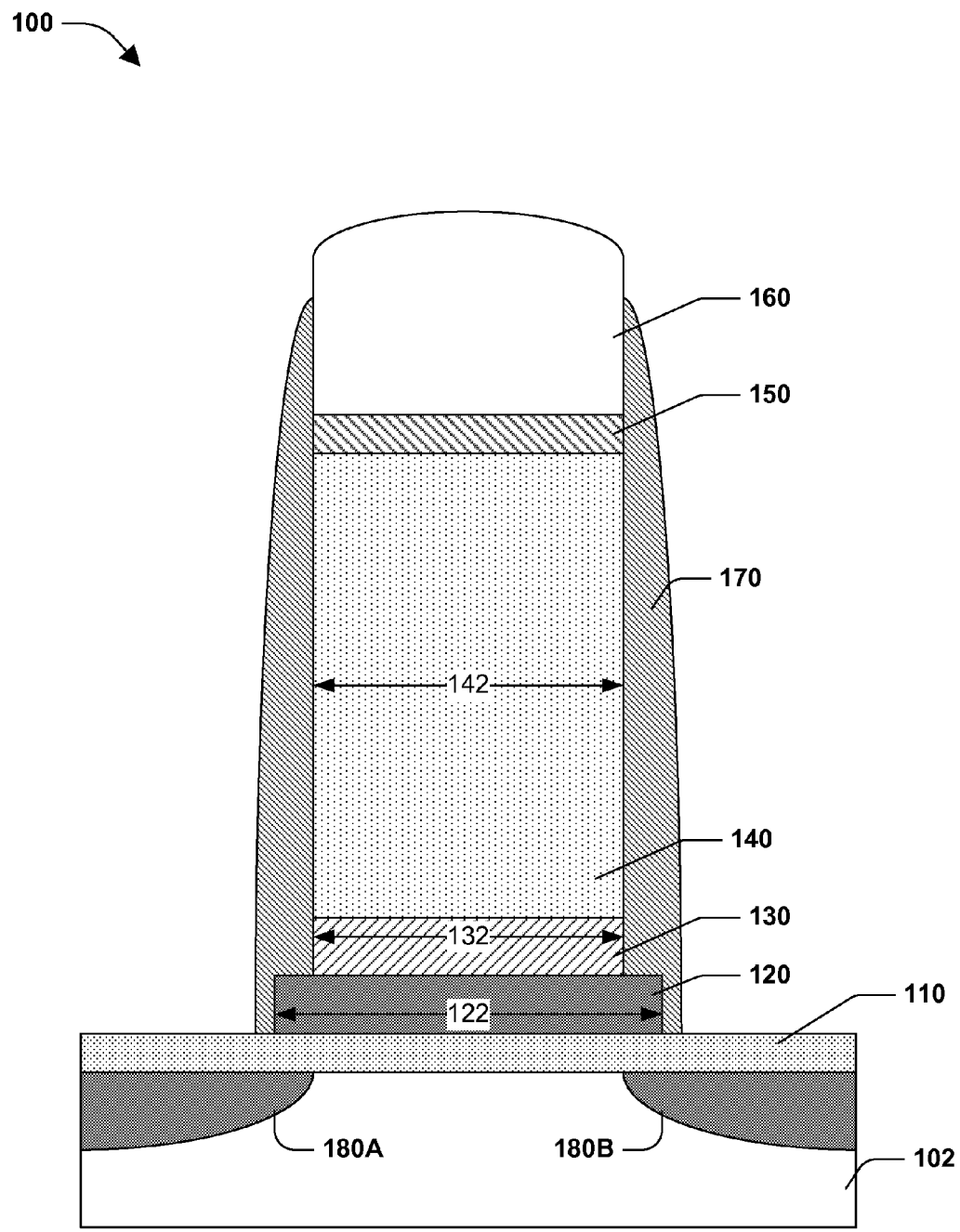
FIG. 1 is a cross-sectional view of a semiconductor structure, according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

As used herein, the "+" symbol or a plus region is indicative of strong doping associated with a conductivity type. For example, N+ is indicative of a strongly doped N type region. Conversely, the "−" symbol or a minus region is indicative of weak doping associated with a conductivity type. For example, P− is indicative of a weakly doped P type region.

Figure 8:
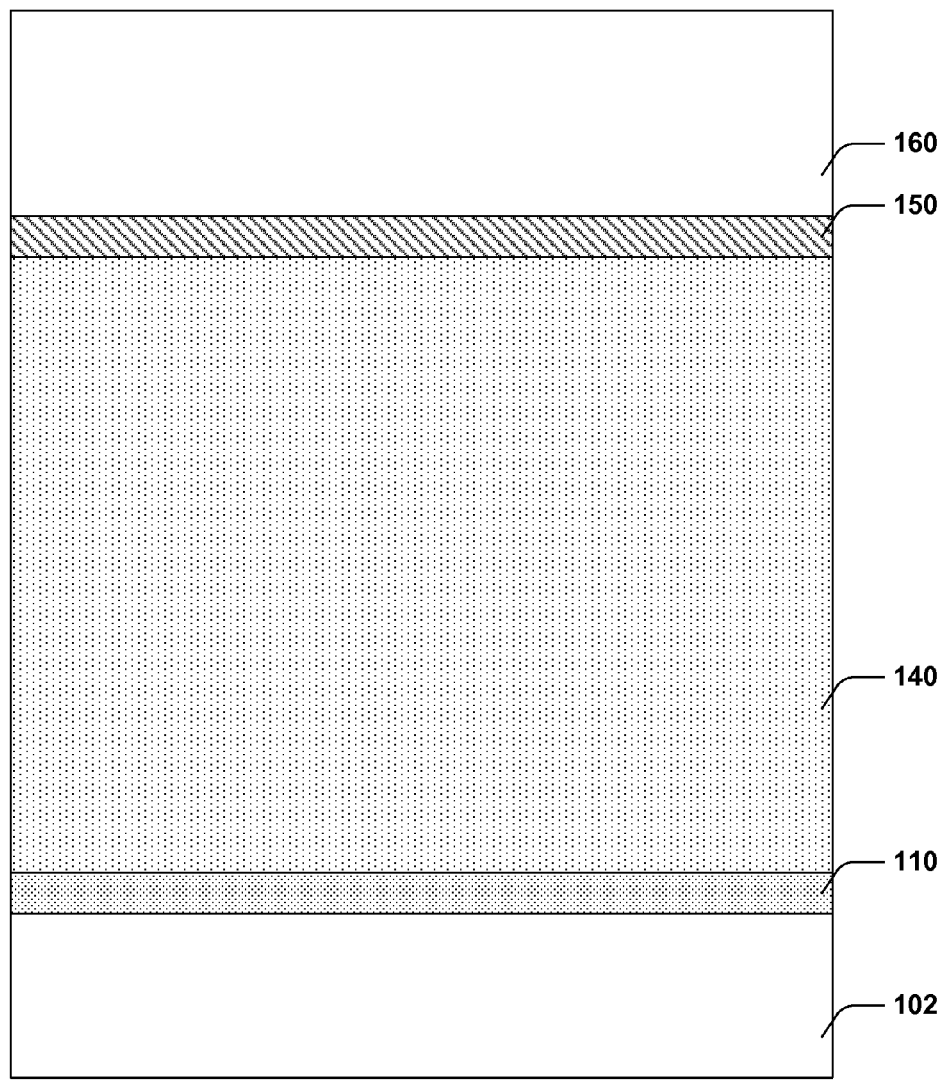
FIG. 8 is a cross-sectional view of a semiconductor structure during an intermediate fabrication stage, according to some embodiments.

It will be appreciated that for some of the figures herein, one or more boundaries, such as boundary 802 and 804 of FIG. 8, for example, are drawn with different heights, widths, perimeters, aspect ratios, etc. relative to one another merely for illustrative purposes, and are not necessarily drawn to scale. For example, because dashed or dotted lines are used to represent different boundaries, if the dashed and dotted lines were drawn on top of one another they would not be distinguishable in the figures, and thus are drawn with different dimensions or slightly apart from one another, in some of the figures, so that they are distinguishable from one another. As another example, where a boundary is associated with an irregular shape, the boundary, such as a box drawn with a dashed line, dotted lined, etc., does not necessarily encompass an entire component in some instances. Conversely, a drawn box does not necessarily encompass merely an associated component, in some instances, but encompasses at least a portion of one or more other components as well.

At least some of the following figures illustrate formation of a semiconductor structure during intermediate stages of semiconductor fabrication, according to some embodiments. It will be appreciated that at least some of the respective figures are described with reference to one another, such as with reference to a previous figure, for example.

FIG. 1 is a cross-sectional view 100 of a semiconductor structure, according to some embodiments. The semiconductor structure includes a substrate 102, an interface layer (IL) 110, a high-k (HK) stack 120, a gate region 130, a dummy poly region 140, a first hard mask (HM) region 150, a second HM region 160, a seal spacer region 170, a first lightly doped drain (LDD) 180A, and a second LDD 180B.

Generally, the substrate 102 includes silicon or germanium. The IL 110 generally includes a thin dielectric film, and is formed through epitaxial growth, atomic layer deposition (ALD), thermal oxidation, or another suitable process. Where the substrate 102 includes silicon or germanium, for example, the IL 110 is formed to include a nitride or oxide. The IL 110 improves adhesion between the substrate 102 and subsequent layers. In an embodiment, the IL 110 has a thickness of between about 5 Å to about 25 Å. The HK stack 120 is formed on the IL 110, and includes a high-k dielectric material, such as a material with a dielectric constant greater than about 20, for example. In some embodiments, the HK stack 120 is formed by ALD and has a thickness of between about 3 Å to about 30 Å. The gate region 130 is formed on the HK stack 120. In some embodiments, the gate region 130 includes titanium nitride and has a thickness of between about 3 Å to about 50 Å and is formed by plasma enhanced chemical vapor deposition (PECVD). The dummy poly region 140 is formed on the gate region 130. The dummy poly region 140 includes polysilicon, has a thickness of between about 500 Å to about 1000 Å, and is formed by ALD, in some embodiments.

The first HM region 150 is formed on the dummy poly region 140. In some embodiments, the first HM region 150 has a thickness of between about 50 Å to about 500 Å, and is formed by ALD. The second HM region 160 is formed on the first HM region 150. In some embodiments, the second HM region 160 has a thickness of between about 50 Å to about 2000 Å, and is formed by PECVD. In some embodiments at least one of the first HM region 150 or the second HM region 160 include polysilicon. The seal spacer region 170 is formed to surround at least some of at least one of the HK stack 120, the gate region 130, the dummy poly region 140, the first HM region 150, or the second HM region 160. In some embodiments, the seal spacer region is formed by ALD and has a thickness of between about 3 Å to about 50 Å.

In some embodiments, the HK stack 120 is formed to have a HK stack width 122. Similarly, the gate region 130 is formed to have a gate region width 132 and the dummy poly region 140 is formed to have a dummy poly width 142. It will be appreciated that the HK stack width 122 is greater than at least one of the gate region width 132 or the dummy poly width 142. Due to the HK stack width 122, at least some of the HK stack 122 overlaps at least some of at least one of the first lightly doped drain (LDD) 180A or the second LDD 180B, according to some embodiments. That is, a gap or lateral distance between the HK stack 122 and the first LDD 180A, between the HK stack 122 and the second LDD 180B, or between the HK stack 122 and both the first LDD 180A and the second LDD 180B is thereby mitigated or made nonexistent. The lack of, or reduction in, such a gap improves saturation current and threshold voltages for the semiconductor structure of FIG. 1. Additionally, because of the HK stack width 122, a greater amount or surface area of the IL 110 is protected from particle bombardment during LDD implanting.

In some embodiments, the gate region width 132 is substantially equal to the HK stack width 122. In some embodiments, the dummy poly width 142 is less than the HK stack width 122. Additionally, a first HM width of the first HM 150 and a second HM width of the second HM 160 is less than the HK stack width 122.

Figure 2:
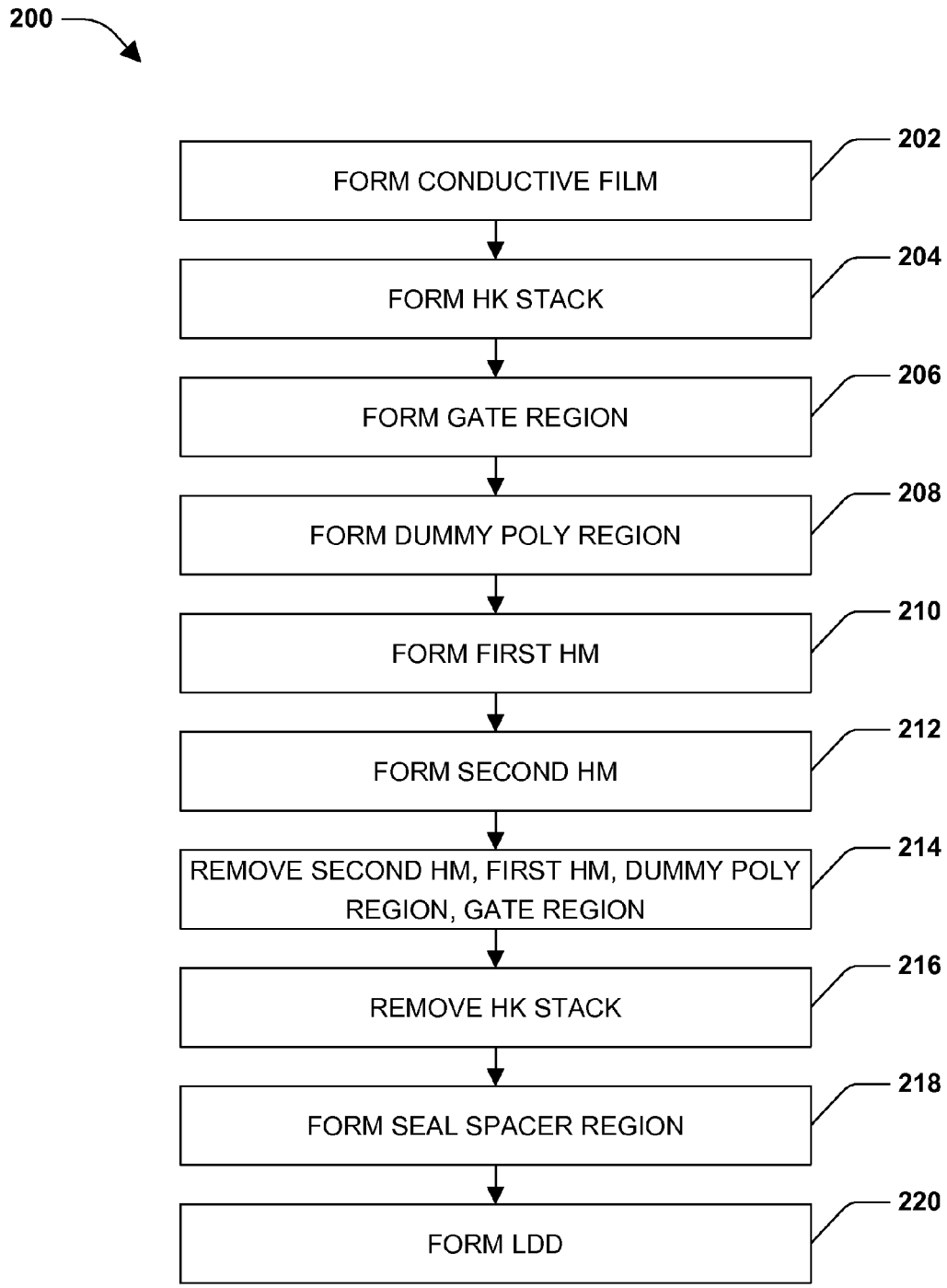
FIG. 2 is a flow diagram of a method for forming a semiconductor structure, according to some embodiments.

FIG. 2 is a flow diagram of a method 200 for forming a semiconductor structure, according to some embodiments. At 302, an IL is formed on a substrate. For example, the IL is formed of by ALD, and has a thickness of between about 5 Å to about 25 Å, in some embodiments. At 204, a HK stack is formed on the IL. The HK stack includes dielectric material and has a dielectric constant greater than about 20, in some embodiments. The HK stack is formed by ALD, and has a thickness of between about 3 Å to about 30 Å, in some embodiments. At 206, a gate region is formed on the HK stack. The gate region has a thickness of between about 3 Å to about 50 Å, and is formed by PECVD, in some embodiments. At 208, a dummy poly region is formed on the gate region. The dummy poly region has a thickness of between about 500 Å to about 1000 Å, and is formed by PECVD, in some embodiments. At 210, a first HM region is formed on the dummy poly region. At 212, a second HM region is formed on the first HM region.

At 214, at least some of at least one of the second HM region, the first HM region, the dummy poly region, or the gate region is removed. In some embodiments, such removal facilitates forming the gate region to have a gate region width. In some embodiments, the second HM region, the first HM region, and the dummy poly region respectively have widths substantially equal to or less than the gate region width. Generally, wet etching is used to achieve removal at 214. However, in some embodiments dry etching is used as well or alternatively. In some embodiments, the gate region includes titanium nitride, which acts as an etch stop layer. At 216, at least some of the HK stack is removed such that the HK stack has a HK stack width greater than the gate region width of the gate region. In some embodiments, dry etching is used to remove some of the HK stack. However, in some embodiments wet etching is used as well or alternatively. It will be appreciated that by adjusting pressure, temperature, or chemistries alone or in combination with other variables, at least one of a dry etching process or a wet etching process is controlled to achieve a desired HK stack width greater than the gate region width. For example, adjusting one or more of the foregoing variables allows an etch selectivity to be varied for one or more regions, such as the HK stack.

At 218, a seal spacer region is formed to surround at least some of at least one of the HK stack, the gate region, the dummy poly region, the first HM region, or the second HM region. The seal spacer region is formed by ALD and has a thickness between about 3 Å to about 50 Å, in some embodiments. At 220, LDDs are formed. A first LDD and a second LDD are formed by ion implantation typically at an angle relative to a surface of the substrate. It will be appreciated that because of the HK stack width, a gap or lateral distance between the HK stack and at least one of the firs LDD or the second LDD is mitigated. In this way, an amount of energy required to form the first LDD and the second LDD is reduced because angled implants do not have to be implanted as far in the substrate to overlap or be closer to the HK stack. Additionally, saturation current and threshold voltages for an associated semiconductor structure are improved. It will be appreciated that the thicknesses, properties, materials, dimensions, etc. provided herein are not to be construed in a limiting manner. For example, other values for the same are within the contemplated scope of the present disclosure.

Figure 3:
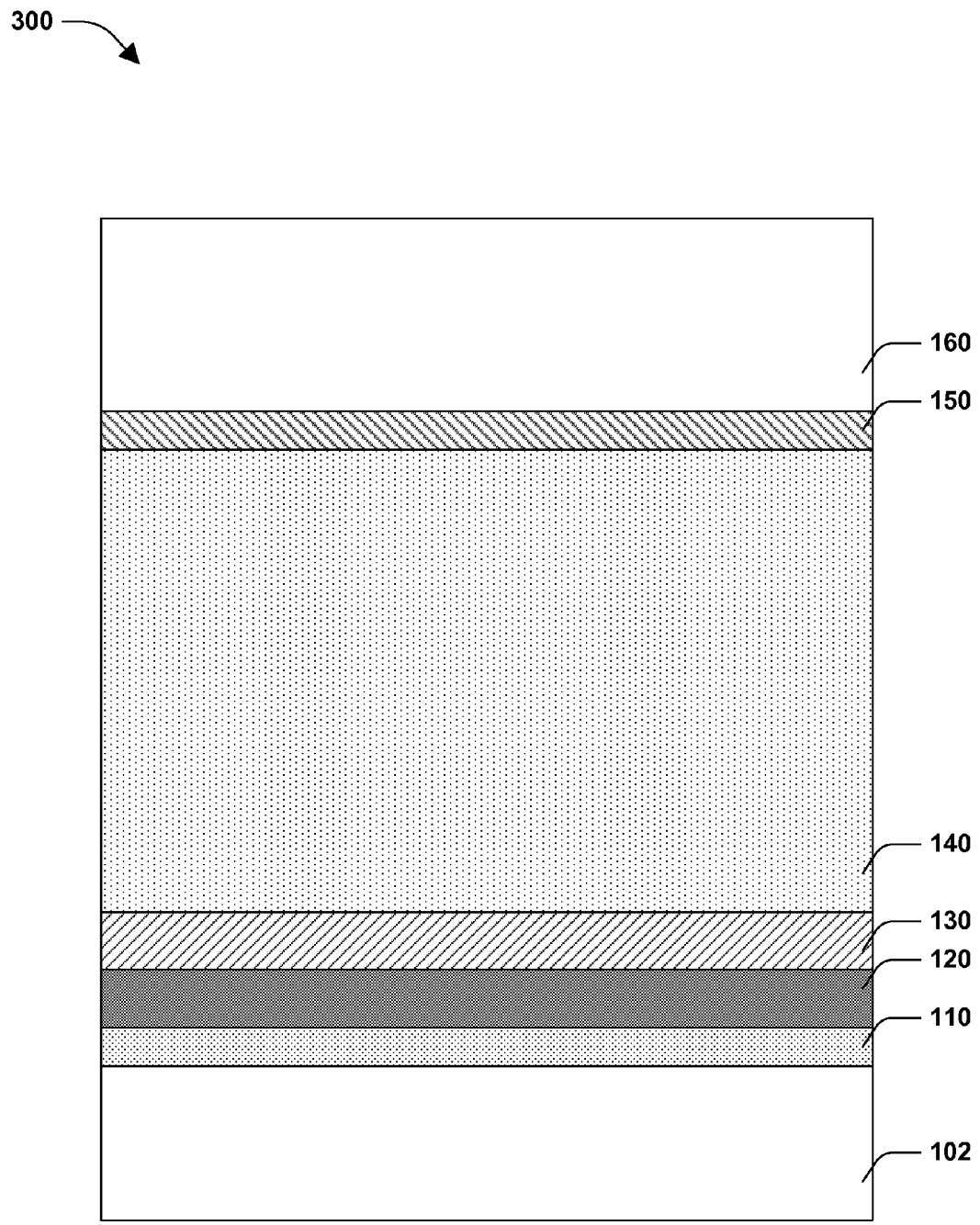
FIG. 3 is a cross-sectional view of a semiconductor structure during an intermediate fabrication stage, according to some embodiments.

FIG. 3 is a cross-sectional view 300 of a semiconductor structure during an intermediate fabrication stage, according to some embodiments. An IL 110 is formed on a substrate 102. A HK stack 120 is formed on the IL 110. Generally, the HK stack 120 mitigates damage to the IL 110 during LDD implanting. A gate region 130 is formed on the HK stack 120. A dummy poly region 140 is formed on the gate region 130. A first HM region 150 is formed on the dummy poly region 140. A second HM region 160 is formed on the first HM region 150.

Figure 4:
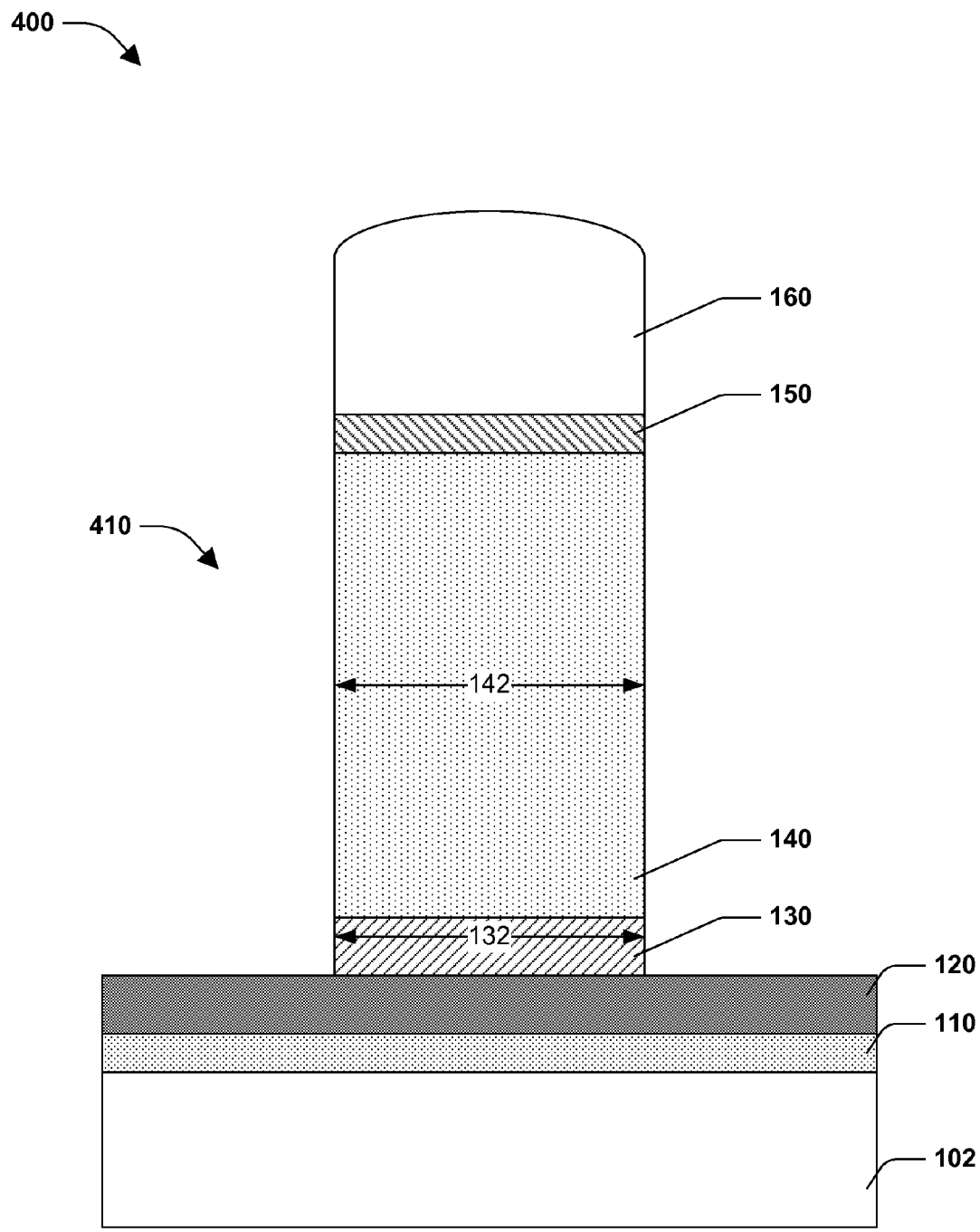
FIG. 4 is a cross-sectional view of a semiconductor structure during an intermediate fabrication stage, according to some embodiments.

FIG. 4 is a cross-sectional view 400 of a semiconductor structure during an intermediate fabrication stage, according to some embodiments. At least some of at least one of the second HM region 160, the first HM region 150, the dummy poly region 140, or the gate region 130 are removed, as seen at 410. It will be appreciated that the removal is achieved through wet etching or dry etching or through both wet etching and dry etching, and that a desired gate region width 132 or a desired dummy poly width 142 are achieved. In some embodiments, the gate region width 132 is substantially equal to the dummy poly width 142. Additionally, widths associated with the first HM region 150 and the second HM region 160 are substantially equal to or less than at least one of the gate region width 132 or the dummy poly width 142.

Figure 5:
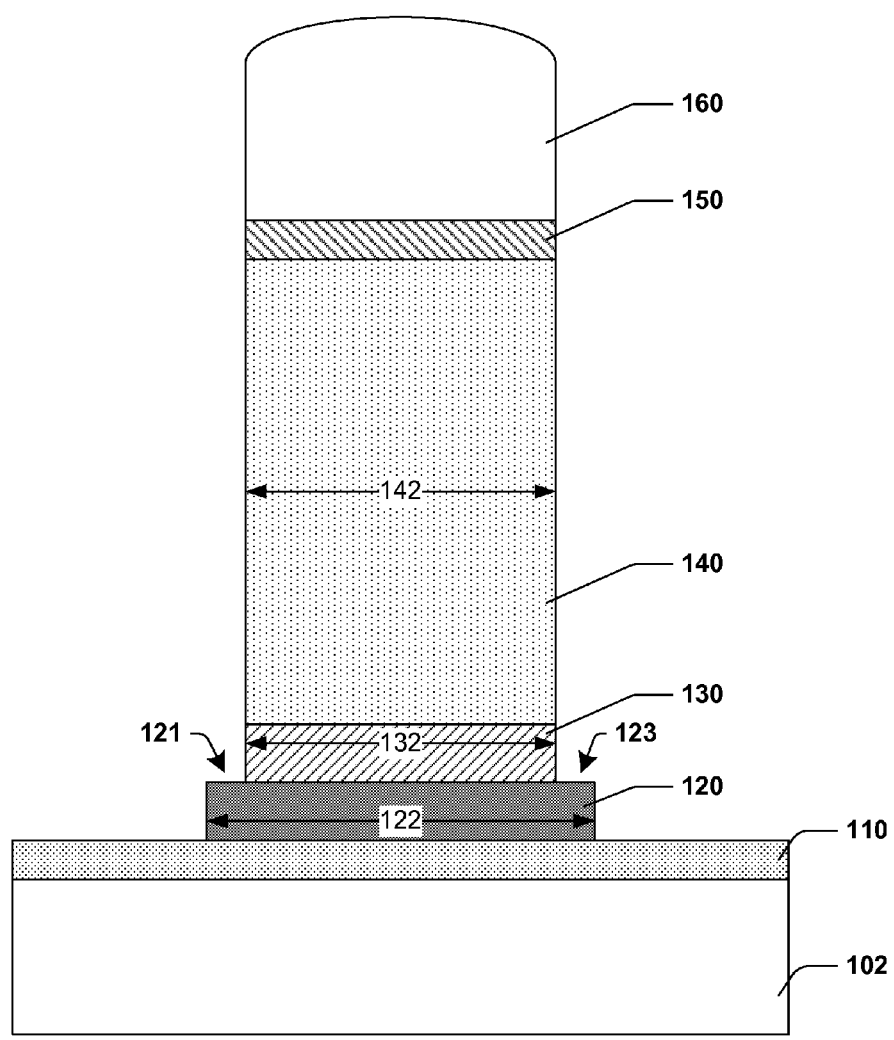
FIG. 5 is a cross-sectional view of a semiconductor structure during an intermediate fabrication stage, according to some embodiments.

FIG. 5 is a cross-sectional view 600 of a semiconductor structure during an intermediate fabrication stage, according to some embodiments. At least some of the HK stack 120 is removed such that the HK stack 120 has a HK stack width 122 greater than the dummy poly width 142, greater than the gate region width 132, or greater than both the dummy poly width 142 and the gate region width 132. In some embodiments, dry etching is used to achieve the HK stack width 122. However, in some embodiments wet etching is used as well or alternatively. In some embodiments, at least one of $CHF_3$, $CH_4$, $Cl_2$, $BCl_3$, $NO_2$, or Ar are used, along with controlling one or more of temperature, pressure, or other variables, to achieve the HK stack width 122. In some embodiments, portions 121, 123 of the HK stack 120 are masked off or otherwise protected during the etching process so as not to be etched away. In some embodiments end point detection is used in etching one or more regions such as the HK stack 120. For example, a detected change in etch rate is indicative of a different region being etched. That is, a first etch selectivity due to a first region having a first composition gives rise to a first etch rate and a second etch selectivity due to a second region having a second composition gives rise to a second etch rate. Accordingly, a detected change from the first etch rate to the second etch rate is indicative of a change from the first region being etched to the second region being etched. In some embodiments, the etching process can be tuned so that one or more regions are etched at a desired rate relative to a rate at which one or more other regions are etched. In this manner, the etching process can be controlled to etch the HK stack so that the HK stack 120 has the HK stack width 122.

Figure 6:
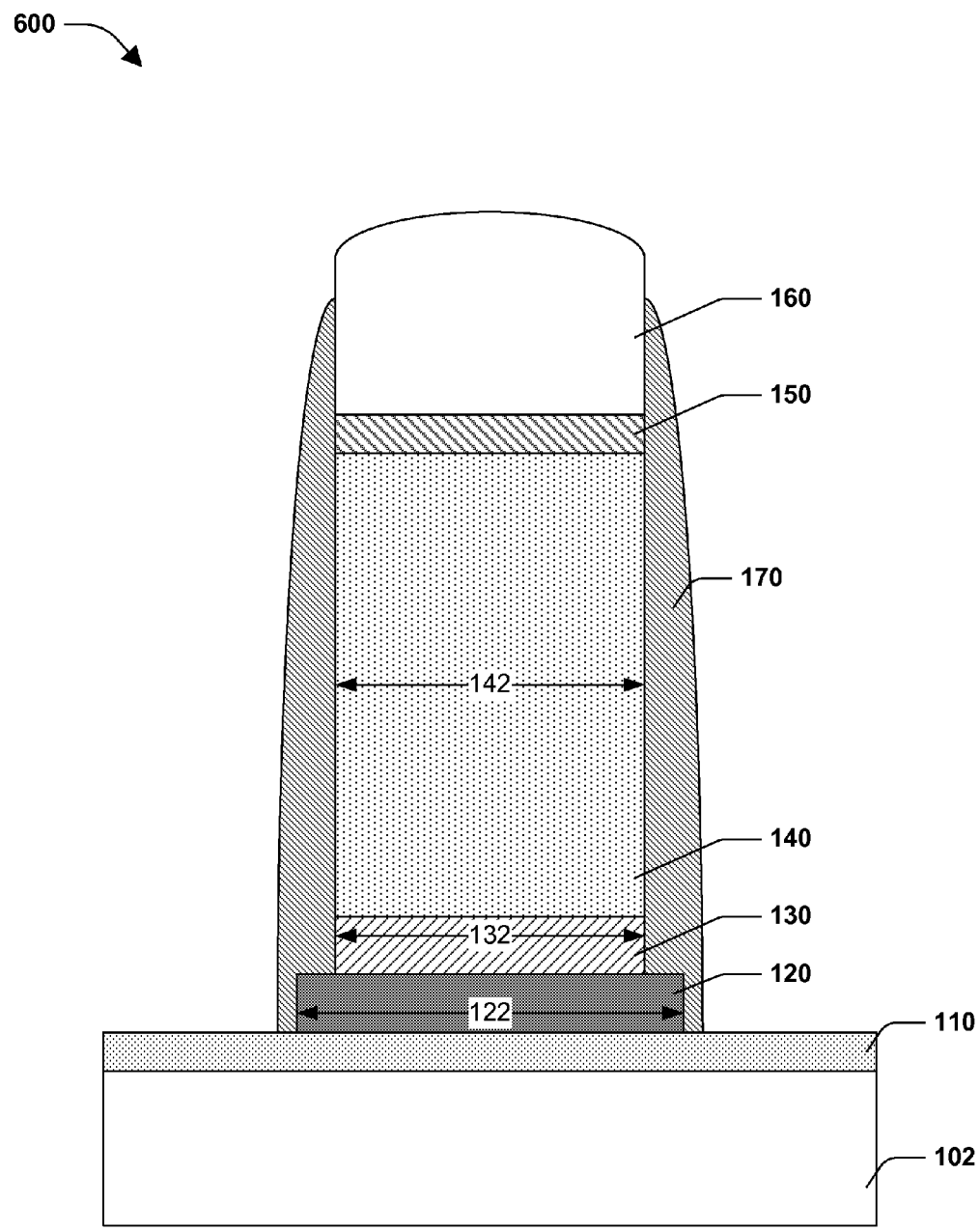
FIG. 6 is a cross-sectional view of a semiconductor structure during an intermediate fabrication stage, according to some embodiments.

FIG. 6 is a cross-sectional view 600 of a semiconductor structure during an intermediate fabrication stage, according to some embodiments. A seal spacer region 170 is formed to surround at least some of at least one of the HK stack 120, the gate region 130, the dummy poly region 140, the first HM region 150, or the second HM region 160. The seal spacer region 170 is used to mitigate undesired interfacial layer growth, as well as protect the dummy poly region 140 during semiconductor fabrication, such as during a wet clean, etc.

Figure 7:
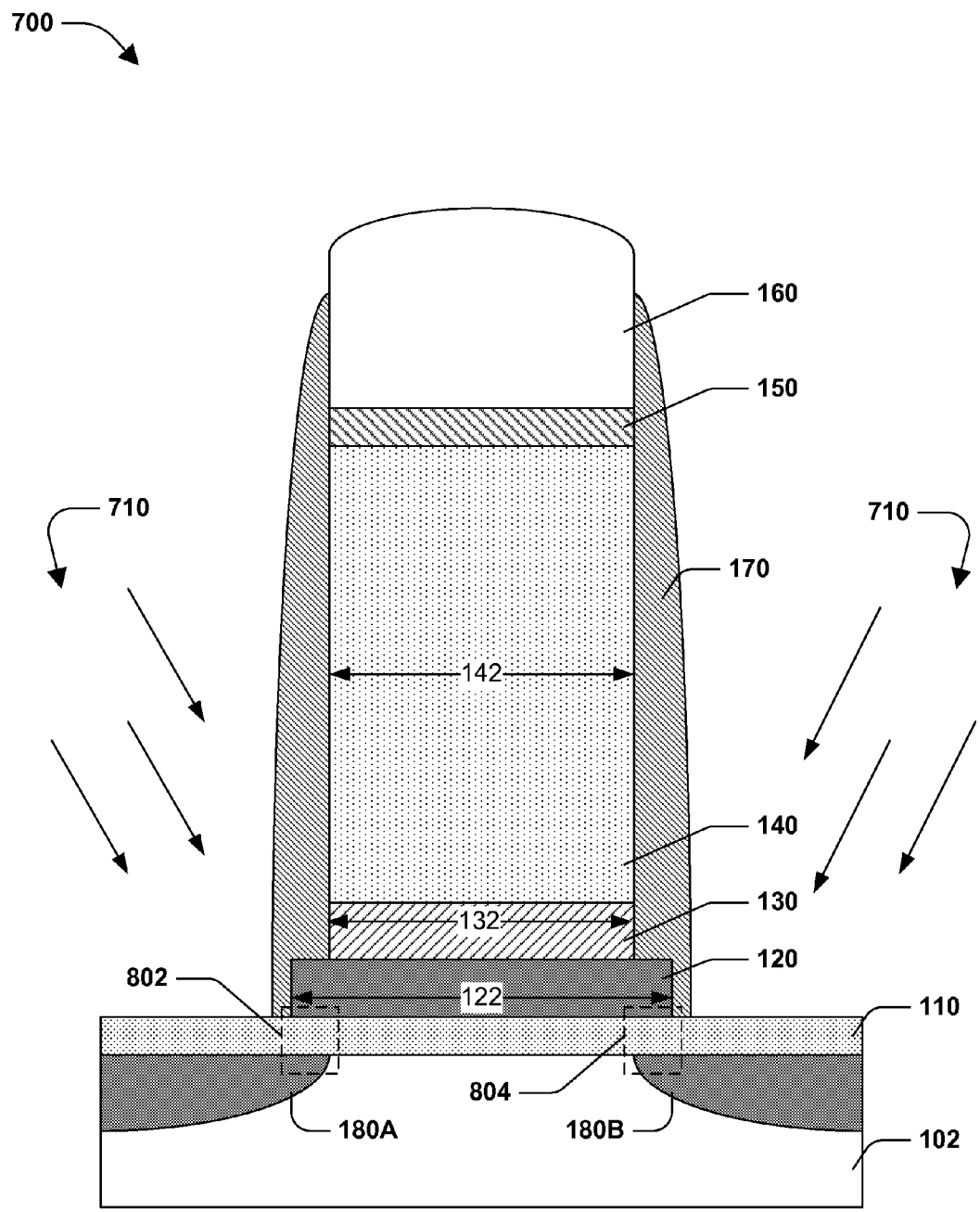
FIG. 7 is a cross-sectional view of a semiconductor structure during an intermediate fabrication stage, according to some embodiments.

FIG. 7 is a cross-sectional view 700 of a semiconductor structure during an intermediate fabrication stage, according to some embodiments. A first LDD 180A and a second LDD 180B are formed by LDD implanting 710, such as ion implantation, etc. The implanting is performed at an angle relative to the surface of the substrate such as between about 30 degrees to about 80 degrees. It will be appreciated that the increased width 122 of the HK stack 120 protects a greater surface area of the IL 110, such as at a first region 802 and a second region 804, from at least some of the LDD implanting 710. Additionally, the increased width 122 of the HK stack 120 also results in at least some of at least one of the first LDD 180A or the second LDD 180B being formed under, or at least closer to, at least a portion of the HK stack 120, thereby improving saturation current and threshold voltages for the semiconductor structure of FIG. 8. It will be appreciated that even if the first LDD 180A or the second LDD 180B are not formed under the HK stack 120, a lateral distance or gap between the HK stack 120 and the first LDD 180A and/or between the HK stack 120 and the second LDD 180B is reduced because of the increased width 122 of the HK stack 120 relative to at least one of the dummy poly width 142 or the gate region width 132, where such a reduced gap also improves a saturation current and threshold voltages for the semiconductor structure.

FIGS. 8-13 illustrate forming the HK stack 120 to have an HK stack width that is greater than a gate width, but without etching the HK stack 120. In some embodiments, regions, features, etc. in FIGS. 8-13 generally have like compositions, dimensions, manners of formation, etc. to like regions, features, etc. described with respect to FIGS. 1-7. FIG. 8 is a cross-sectional view 900 of a semiconductor structure during an intermediate fabrication stage, according to some embodiments. An IL 110 is formed on a silicon substrate 102. A dummy poly region 140 is formed on the IL 110. A first HM region 150 is formed on the dummy poly region 140. A second HM region 160 is formed on the first HM region 150.

Figure 9:
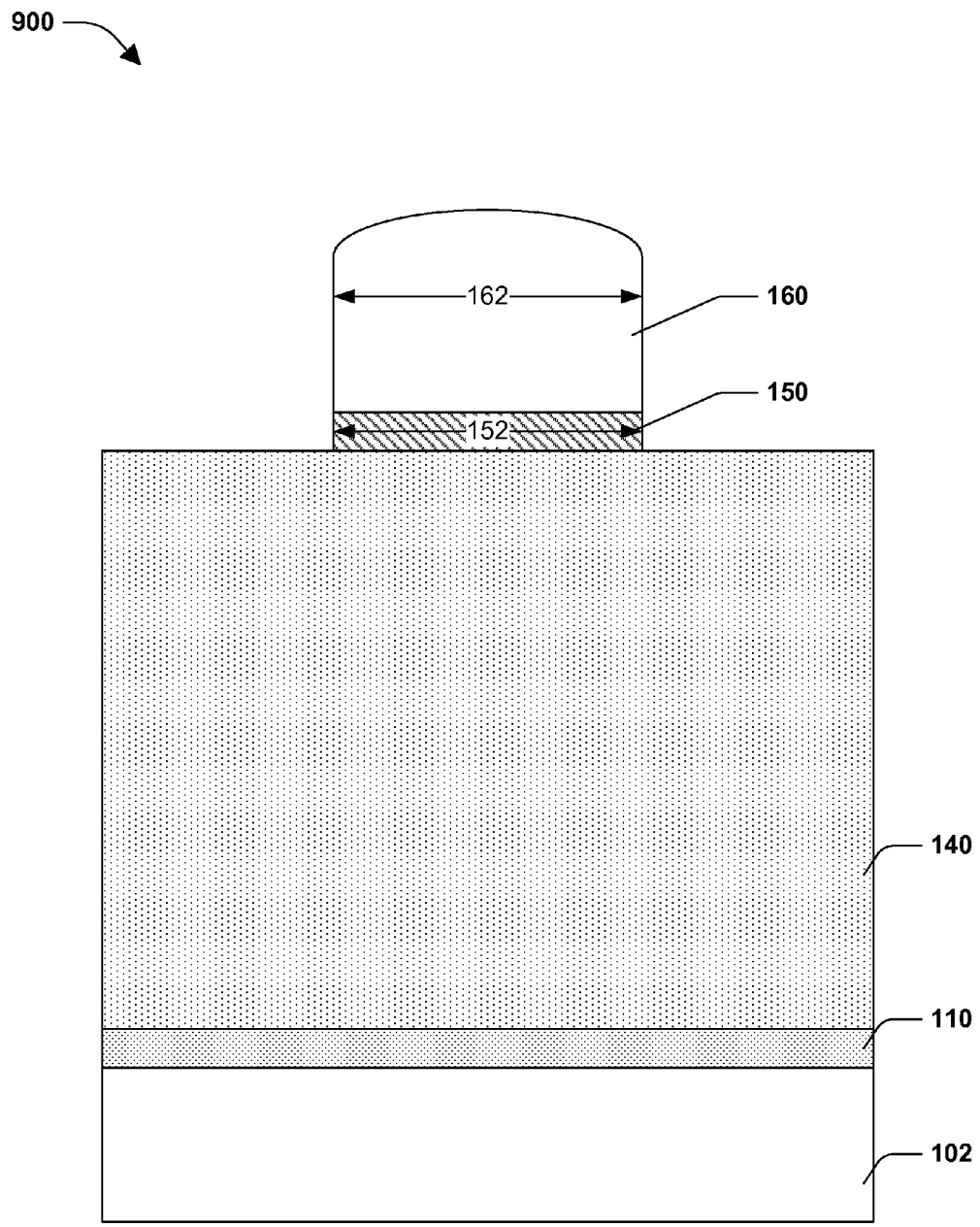
FIG. 9 is a cross-sectional view of a semiconductor structure during an intermediate fabrication stage, according to some embodiments.

FIG. 9 is a cross-sectional view 900 of a semiconductor structure during an intermediate fabrication stage, according to some embodiments. At least some of the second HM region 160 and the first HM region 150 are removed. In some embodiments, the second HM region 160 has a second HM region width 162. Similarly, the first HM region 150 has a first HM region width 152. In some embodiments, the first HM region 150 and the second HM region 160 are removed based on photolithography and wet etching. For example, a layer of photo resist (PR) is formed on the second HM region 160, and a mask is used to open a window in the PR. In some embodiments, the window facilitates removal of the first HM region 150 and the second HM region 160, along with a wet etch. However, in some embodiments dry etching is used as well or alternatively.

Figure 10:
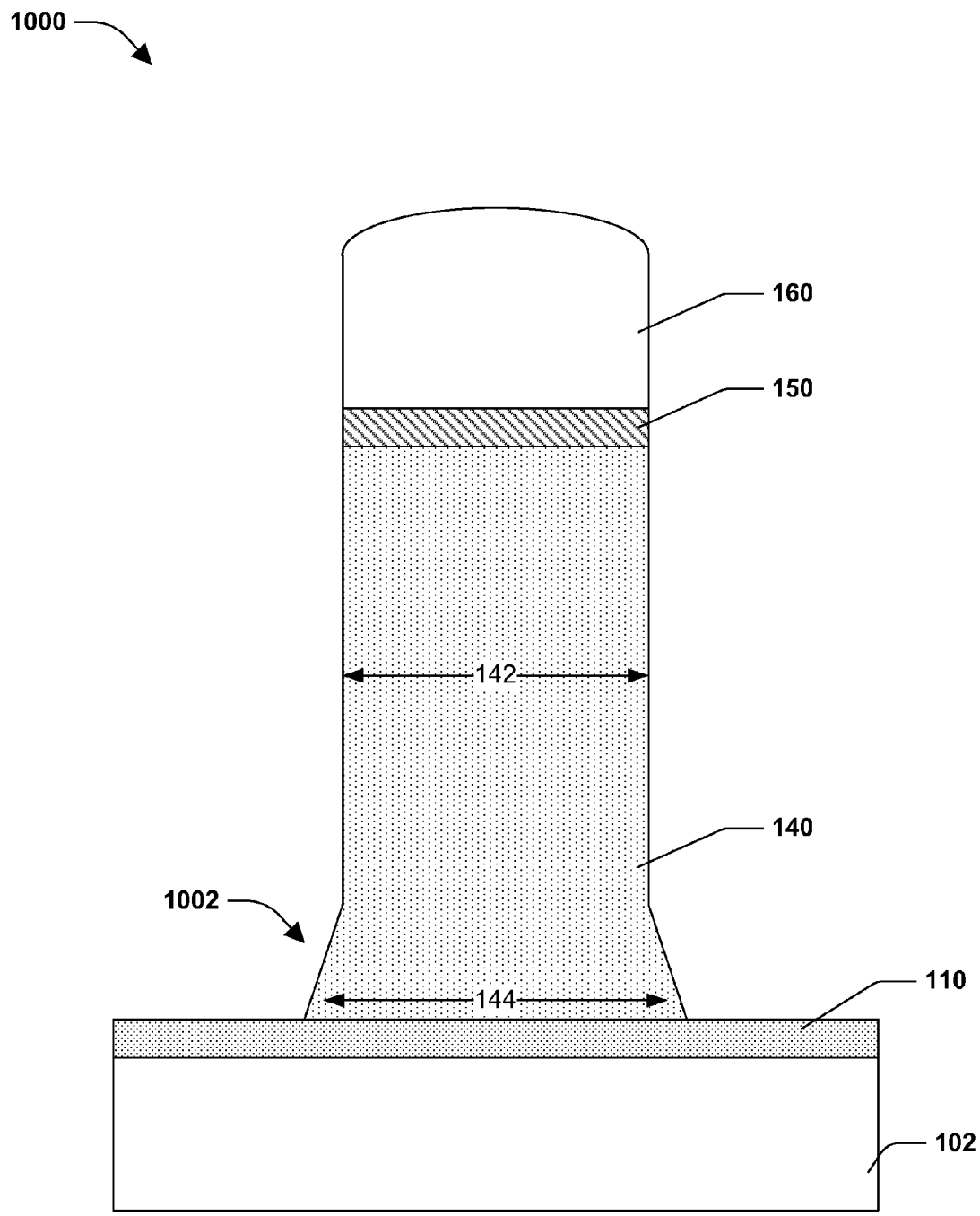
FIG. 10 is a cross-sectional view of a semiconductor structure during an intermediate fabrication stage, according to some embodiments.

FIG. 10 is a cross-sectional view 1000 of a semiconductor structure during an intermediate fabrication stage, according to some embodiments. The dummy poly region 140 is formed with a tapered profile such that a base of the dummy poly region 140 has a base width 144 greater than a top width 142 of a top portion of the dummy poly region 140. In some embodiments, at least one of dry etching or wet etching is used to form the tapered profile 1002 associated with the dummy poly region 140. For example, at least one of temperature or pressure, alone or in combination with one or more other variables, is used to control the etching of the dummy poly region. A direction of etchants, amount of vertical etchants, amount of horizontal etchants, for example, are controlled to form the tapered profile.

Figure 11:
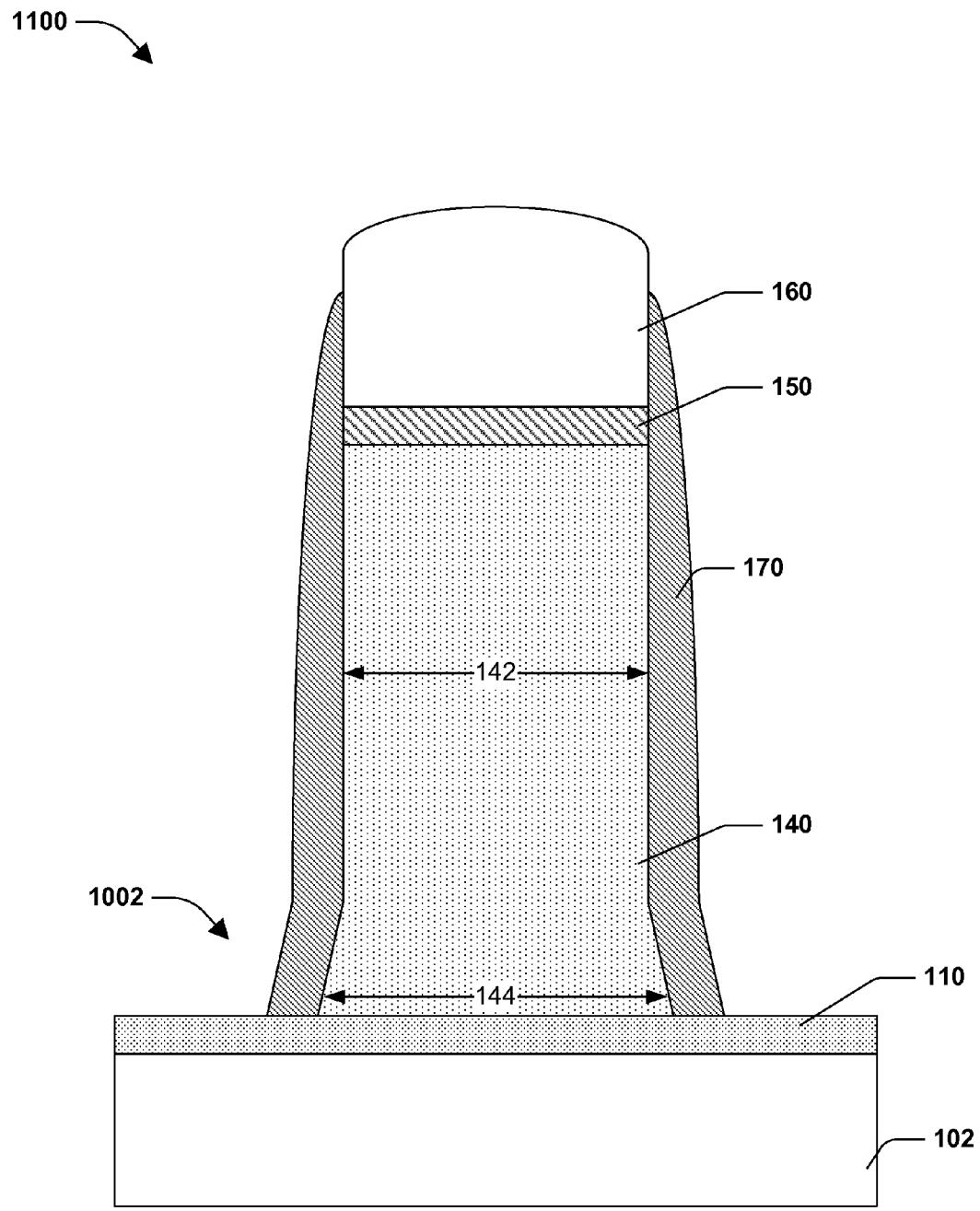
FIG. 11 is a cross-sectional view of a semiconductor structure during an intermediate fabrication stage, according to some embodiments.

FIG. 11 is a cross-sectional view 1100 of a semiconductor structure during an intermediate fabrication stage, according to some embodiments. A seal spacer region 170 is formed to surround at least some of at least one of the dummy poly region 140, the first HM region 150, or the second HM region 160. The seal spacer region 170 mitigates undesired interfacial layer re-growth after implantation and protects the dummy poly region 140 during semiconductor fabrication, wet cleans, etc. In some embodiments, material used in forming the seal spacer 170 is formed over the IL 110 between adjacent semiconductor structures, and those portions of the seal spacer material between adjacent semiconductor structures are thus removed as part of the process of establishing the seal spacer region 170, which conforms to the tapered profile 1002 of the semiconductor structure of FIG. 11.

Figure 12:
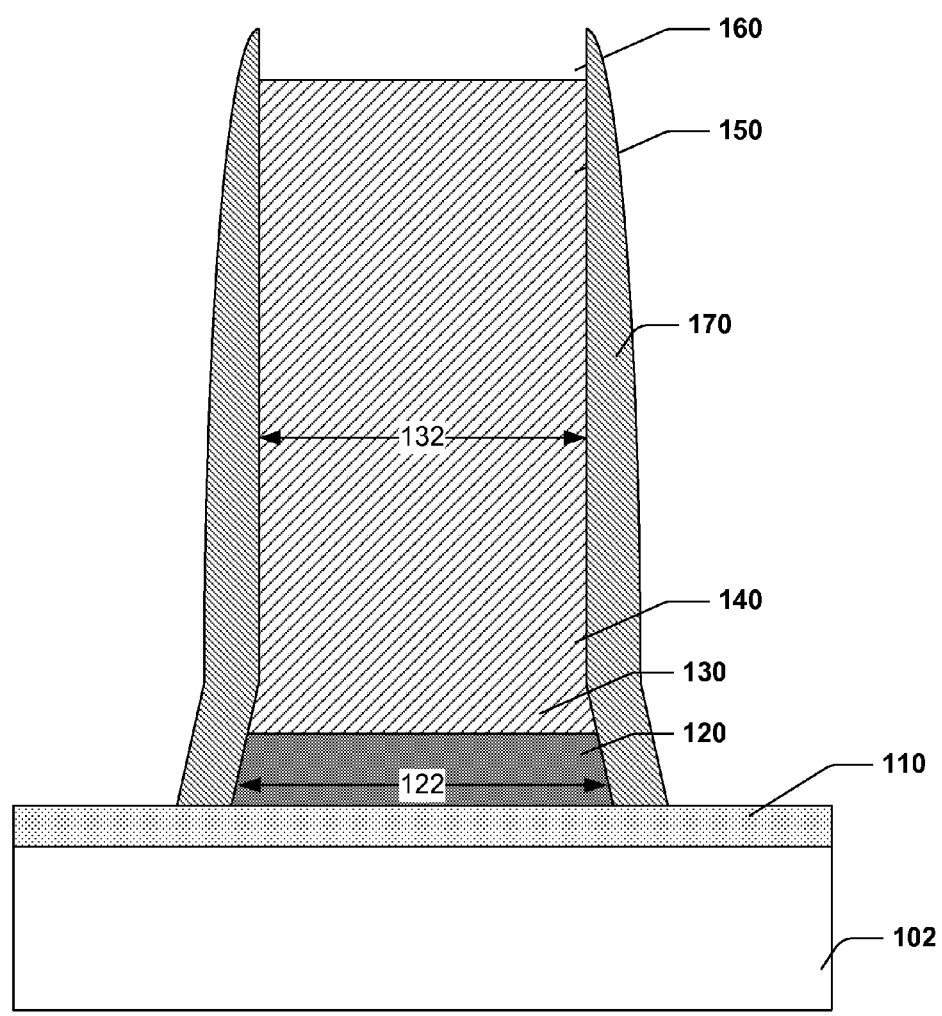
FIG. 12 is a cross-sectional view of a semiconductor structure during an intermediate fabrication stage, according to some embodiments.

FIG. 12 is a cross-sectional view 1200 of a semiconductor structure during an intermediate fabrication stage, according to some embodiments. The dummy poly region 140, the first HM region 150, or the second HM region 160 are removed, such as by a dry etching process, a wet etching process, or both wet and dry etching processes. In some embodiments the seal spacer region 170 is masked off during removal of one or more of the dummy poly region 140, the first HM region 150, or the second HM region 160. Additionally or alternatively, etch selectivity is controlled during removal of one or more of the dummy poly region 140, the first HM region 150, or the second HM region 160 so that seal spacer region 170 is maintained. An HK stack 120 is then formed on the IL 110 within the seal spacer region 170. In some embodiments, the HK stack 120 is formed by at least one of one or more deposition processes or one or more growth processes. The HK stack 120 has a tapered profile akin to the tapered profile of the base of the dummy poly region 140, which has been removed. The HK stack 120 has an HK stack width 122 substantially equal to the base width 144 of the tapered base of the dummy poly region 140. A gate region 130 is then formed on the HK stack 120, such as by at least one of one or more deposition processes or one or more growth processes. The gate region 130 has a gate width 132 substantially equal to the dummy poly width 142 not at the base of the dummy poly region 140. In this manner, the K stack width 122 is greater than the gate width 132.

Figure 13:
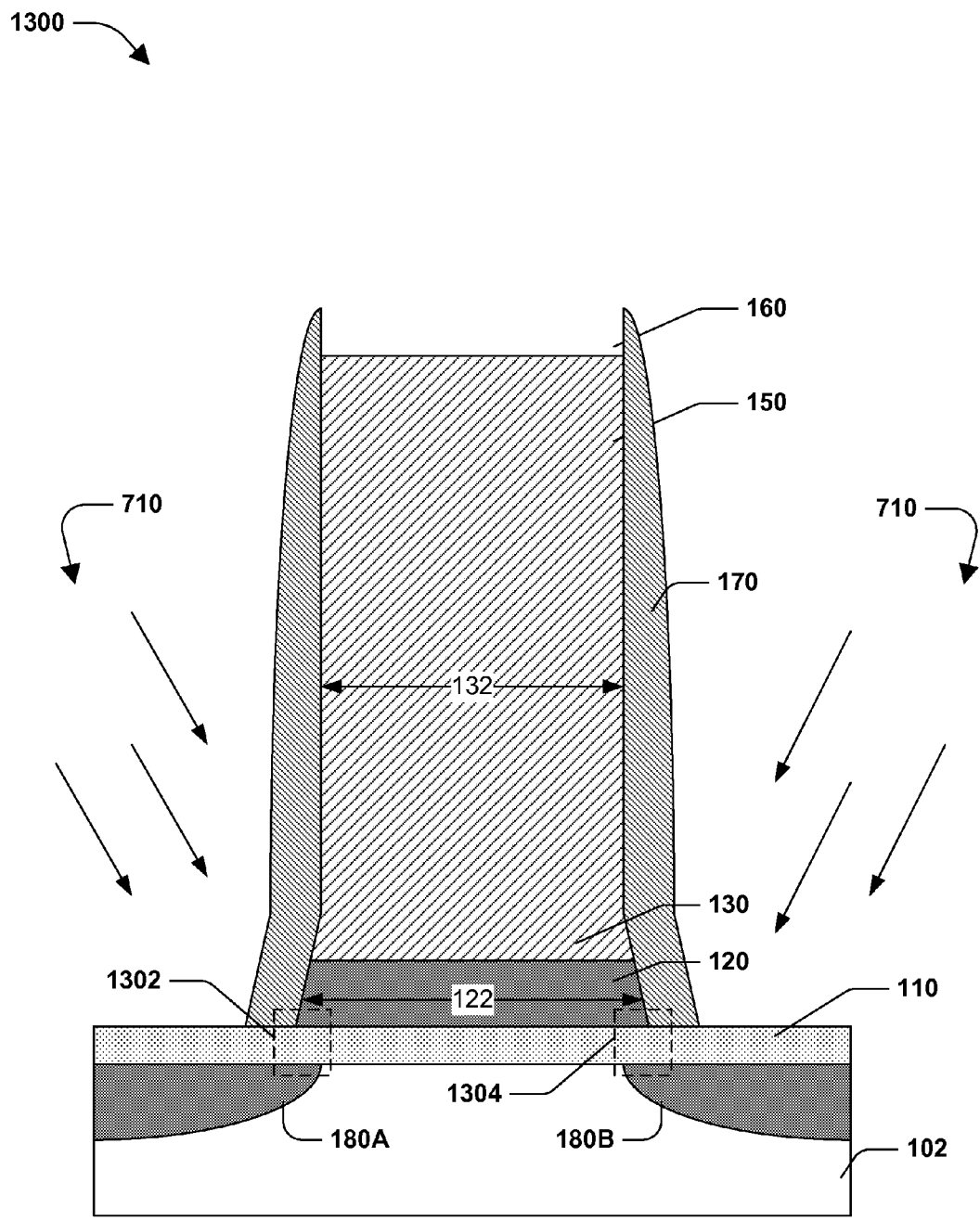
FIG. 13 is a cross-sectional view of a semiconductor structure during an intermediate fabrication stage, according to some embodiments.

FIG. 13 is a cross-sectional view 1300 of a semiconductor structure during an intermediate fabrication stage, according to some embodiments. LDD implanting 710 is used to form a first LDD 180A and a second LDD 180B. It will be appreciated that 1302 and 1304 are regions where the extended width of the HK stack 120, relative to the gate width 132, inhibit damage to the IL 110 from LDD implanting 710. Additionally, the increased width 122 of the HK stack 120 also results in at least some of at least one of the first LDD 180A or the second LDD 180B being formed under, or at least closer to, at least a portion of the HK stack 120, thereby improving saturation current and threshold voltages for the semiconductor structure. It will be appreciated that even if the first LDD 180A or the second LDD 180B are not formed under the HK stack 120, a lateral distance or gap between the HK stack 120 and the first LDD 180A and/or between the HK stack 120 and the second LDD 180B is reduced because of the increased width 122 of the HK stack 120, According to some aspects, a semiconductor structure is provided, comprising a substrate, an interface layer (IL), a high-k stack, and a gate region. The substrate includes a first lightly doped drain (LDD) and a second LDD. The IL is on the substrate. The HK stack is on the IL. The HK stack has a HK stack width. The gate region is on the HK stack. The gate region has a gate region width less than the HK stack width.

According to some aspects, a semiconductor structure is provided. The semiconductor structure comprises a substrate comprising a first lightly doped drain (LDD) and a second LDD. An interface layer (IL) is formed over the substrate, and a HK stack is formed on the IL. The HK stack has a tapered base such that at least some of at least one of the first LDD or the second LDD is under at least a portion of the HK stack. The semiconductor structure also comprises a gate region over the HK stack.

According to some aspects, a method for forming a semiconductor structure is provided. The method comprises forming a high-k (HK) stack on an interface layer (IL) formed on a substrate such that the HK stack has a HK stack width, and forming a gate region on the HK stack such that the gate region has a gate region width that is less than the HK stack width. The method also comprises forming a first lightly doped drain (LDD) and a second LDD within the substrate such that at least some of at least one of the first LDD or the second LDD is under at least a portion of the HK stack.

Although the subject matter has been described in language specific to structural features or methodological acts, it is to be understood that the subject matter of the appended claims is not necessarily limited to the specific features or acts described above. Rather, the specific features and acts described above are disclosed as exemplary embodiments.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that layers, features, regions, elements, such as the substrate, the IL, the high-k (HK) stack, the dummy poly region, the first hard mask (HM) region, the second HM region, the seal spacer region, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, regions, elements, etc. mentioned herein, such as implanting techniques, etching techniques, doping techniques, spin-on techniques, such as spin coating, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD).

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A semiconductor structure, comprising:
   a substrate comprising a first lightly doped drain (LDD);
   an interface layer (IL) on the substrate;
   a high-k (HK) stack on the IL, the HK stack having a HK stack width; and
   a gate region on the HK stack, the gate region having a gate region width less than the HK stack width,
   wherein the first LDD is under at least a portion of the HK stack but not under the gate region.

2. The semiconductor structure of claim 1, at least one of the HK stack or the gate region having a tapered base.

3. The semiconductor structure of claim 1, the gate region comprising titanium nitride (TiN).

4. The semiconductor structure of claim 1, the gate region having a gate region thickness of between about 3 Å to about 50 Å.

5. The semiconductor structure of claim 1, the HK stack having a HK stack thickness of between about 3 Å to about 30 Å.

6. The semiconductor structure of claim 1, the IL comprising at least one of oxide or nitride.

7. The semiconductor structure of claim 1, the IL having an IL thickness of between about 5 Å to about 25 Å.

8. The semiconductor structure of claim 1, comprising a seal spacer region surrounding the HK stack and the gate region.

9. A semiconductor structure, comprising:
   a substrate comprising a first lightly doped drain (LDD);
   an interface (IL) on the substrate;
   a high-k (HK) stack on the IL, the HK stack having a tapered base; and
   a gate region on the HK stack, the gate region having a tapered base.

10. The semiconductor structure of claim 9, comprising a seal spacer region surrounding at least one of the HK stack or the gate region, the seal spacer region having a tapered profile.

11. The semiconductor structure of claim 10, the seal spacer region having a seal spacer thickness of between about 3 Å to about 50 Å.

12. The semiconductor structure of claim 9, the IL comprising at least one of oxide or nitride.

13. The semiconductor structure of claim 9, the IL having an IL thickness of between about 5 Å to about 25 Å.

14. The semiconductor structure of claim 9, the HK stack having a HK stack width that is greater than a gate region width of the gate region.

15. The semiconductor structure of claim 9, the gate region comprising titanium nitride (TiN).

16. The semiconductor structure of claim 9, the gate region having a gate region thickness of between about 3 Å to about 50 Å.

17. The semiconductor structure of claim 9, the HK stack having a HK stack thickness of between about 3 Å to about 30 Å.

18. The semiconductor structure of claim 9, wherein the first LDD is under at least a portion of the HK stack but not under the gate region.

19. A method for forming a semiconductor structure, comprising:
    forming a dummy poly region on a substrate;
    etching the dummy poly region to have a tapered profile;
    forming a seal spacer region around the dummy poly region to have a tapered profile that conforms to the tapered profile of the dummy poly region;
    removing the dummy poly region; and
    forming a high-k (HK) stack where the dummy poly region was removed to have a tapered profile that conforms to the tapered profile of the seal spacer region.

20. The method of claim 19, the etching comprising controlling at least one of a direction of etchants, an amount of vertical etchants, or an amount of horizontal etchants to form the tapered profile of the dummy poly region.

* * * * *